United States Patent
Khadiwala et al.

(10) Patent No.: US 10,498,822 B2
(45) Date of Patent: Dec. 3, 2019

(54) ADAPTIVE SCANNING RATES

(71) Applicant: International Business Machines Corporation, Armonk, NY (US)

(72) Inventors: Ravi V. Khadiwala, Bartlett, IL (US); Ethan S. Wozniak, Park Ridge, IL (US); Jason K. Resch, Chicago, IL (US)

(73) Assignee: PURE STORAGE, INC., Mountain View, CA (US)

(*) Notice: Subject to any disclaimer, the term of this patent is extended or adjusted under 35 U.S.C. 154(b) by 30 days.

(21) Appl. No.: 15/831,965

(22) Filed: Dec. 5, 2017

(65) Prior Publication Data

US 2018/0109614 A1   Apr. 19, 2018

Related U.S. Application Data

(63) Continuation-in-part of application No. 15/812,706, filed on Nov. 14, 2017, now Pat. No. 10,362,111, (Continued)

(51) Int. Cl.
*H03M 13/15* (2006.01)
*H04L 29/08* (2006.01)
(Continued)

(52) U.S. Cl.
CPC ...... *H04L 67/1097* (2013.01); *G06F 11/1076* (2013.01); *H04L 67/10* (2013.01);
(Continued)

(58) Field of Classification Search
CPC .................................................. H03M 13/11
(Continued)

(56) References Cited

U.S. PATENT DOCUMENTS 4,092,732 A   5/1978 Ouchi
5,454,101 A   9/1995 Mackay et al.
(Continued)

OTHER PUBLICATIONS

Chung; An Automatic Data Segmentation Method for 3D Measured Data Points; National Taiwan University; pp. 1-8; 1998.
(Continued)

*Primary Examiner* — Fritz Alphonse
(74) *Attorney, Agent, or Firm* — Garlick & Markison; Edward J. Marshall (57) ABSTRACT

A distributed storage network (DSN) stores encoded data slices in dispersed storage (DS) memories using a DSN namespace divided into a plurality of DSN address ranges. Multiple scanning modules, each including a processor and associated memory, identify DSN address ranges for detection of storage errors within the DSN namespace, and initiate scanning for storage errors within the identified DSN address ranges. The scanning is performed in accordance with a scanning rate associated with each individual scanning module. Each scanning module obtains a target scanning performance level, which specifies a scanning performance level for the detection of storage errors across multiple DSN address ranges associated with more than one scanning module, and determines an actual scanning performance level for storage error detection across the same range of DSN addresses. The scanning modules cooperatively determine an updated scanning rate for each scanning module based on the target scanning performance level and the actual scanning performance level. The scanning rate of at least one of the plurality of scanning modules is altered to match the updated scanning rate.

20 Claims, 6 Drawing Sheets

Related U.S. Application Data which is a continuation of application No. 14/956,818, filed on Dec. 2, 2015, now Pat. No. 9,826,038.

(60) Provisional application No. 62/109,712, filed on Jan. 30, 2015.

(51) Int. Cl.
  *G06F 11/10* (2006.01)
  *H03M 13/37* (2006.01)
  *H03M 13/09* (2006.01)

(52) U.S. Cl.
  CPC ........ *H03M 13/09* (2013.01); *H03M 13/1515* (2013.01); *H03M 13/3761* (2013.01)

(58) Field of Classification Search
  USPC ...................................................... 714/759
  See application file for complete search history.

(56) References Cited

U.S. PATENT DOCUMENTS

| | | | |
|---|---|---|---|
| 5,485,474 A | 1/1996 | Rabin | |
| 5,774,643 A | 6/1998 | Lubbers et al. | |
| 5,802,364 A | 9/1998 | Senator et al. | |
| 5,809,285 A | 9/1998 | Hilland | |
| 5,890,156 A | 3/1999 | Rekieta et al. | |
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 | 12/2009 | de la Torre et al. | |
| 2002/0062422 A1 | 5/2002 | Butterworth et al. | |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0215998 A1 | 10/2004 | Buxton et al. | |
| 2004/0228493 A1 | 11/2004 | Ma | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula | |
| 2005/0132070 A1 | 6/2005 | Redlich et al. | |
| 2005/0144382 A1 | 6/2005 | Schmisseur | |
| 2005/0229069 A1 | 10/2005 | Hassner et al. | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 | 10/2006 | Correll | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0214285 A1 | 9/2007 | Au et al. | |
| 2007/0234110 A1 | 10/2007 | Soran et al. | |
| 2007/0283167 A1 | 12/2007 | Venters et al. | |
| 2009/0094251 A1 | 4/2009 | Gladwin et al. | |
| 2009/0094318 A1 | 4/2009 | Gladwin et al. | |
| 2010/0023524 A1 | 1/2010 | Gladwin et al. | |
| 2015/0227414 A1 | 8/2015 | Varma | |
| 2015/0268970 A1* | 9/2015 | Mudusuru | G06F 9/4411 713/1 |
| 2016/0117219 A1 | 4/2016 | Halbert et al. | |
| 2017/0149924 A1* | 5/2017 | Peterson | H04L 67/2852 |
| 2017/0181105 A1* | 6/2017 | John | H04W 52/283 |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

Legg; Lightweight Directory Access Protocol (LDAP): Syntaxes and Matching Rules; IETF Network Working Group; RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

Satran, et al.; Internet Small Computer Systems Interface (iSCSI); IETF Network Working Group; RFC 3720; Apr. 2004; pp. 1-257.

Sciberras; Lightweight Directory Access Protocol (LDAP): Schema for User Applications; IETF Network Working Group; RFC 4519; Jun. 2006; pp. 1-33.

Sermersheim; Lightweight Directory Access Protocol (LDAP): The Protocol; IETF Network Working Group; RFC 4511; Jun. 2006; pp. 1-68.

Shamir; How to Share a Secret; Communications of the ACM; vol. 22, No. 11; Nov. 1979; pp. 612-613.

Smith; Lightweight Directory Access Protocol (LDAP): String Representation of Search Filters; IETF Network Working Group; RFC 4515; Jun. 2006; pp. 1-12.

Smith; Lightweight Directory Access Protocol (LDAP): Uniform Resource Locator; IETF Network Working Group; RFC 4516; Jun. 2006; pp. 1-15.

Wildi; Java iSCSi Initiator; Master Thesis; Department of Computer and Information Science, University of Konstanz; Feb. 2007; 60 pgs.

Xin, et al.; Evaluation of Distributed Recovery in Large-Scale Storage Systems; 13th IEEE International Symposium on High Performance Distributed Computing; Jun. 2004; pp. 172-181.

Zeilenga; Lightweight Directory Access Protocol (LDAP): Internationalized String Preparation; IETF Network Working Group; RFC 4518; Jun. 2006; pp. 1-14.

(56) References Cited

OTHER PUBLICATIONS

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): Directory Information Models; IETF Network Working Group; RFC 4512; Jun. 2006; pp. 1-49.

Zeilenga; Lightweight Directory Access Protocol (LDAP): String Representation of Distinguished Names; IETF Network Working Group; RFC 4514; Jun. 2006; pp. 1-15.

* cited by examiner

ADAPTIVE SCANNING RATES

CROSS-REFERENCE TO RELATED APPLICATIONS

The present U.S. Utility Patent Application claims priority pursuant to 35 U.S.C. § 120 as a continuation-in-part of U.S. Utility application Ser. No. 15/812,706 entitled "SELECTING A DATA STORAGE RESOURCE OF A DISPERSED STORAGE NETWORK" filed Nov. 14, 2017, which claims priority pursuant to 35 U.S.C. § 120 as a continuation of U.S. Utility application Ser. No. 14/956,818 entitled "SELECTING A DATA STORAGE RESOURCE OF A DISPERSED STORAGE NETWORK" filed Dec. 2, 2015, now U.S. Pat. No. 9,826,038 issued on Nov. 21, 2017, which claims priority pursuant to 35 U.S.C. § 119(e) to U.S. Provisional Application No. 62/109,712, entitled "UTILIZING ALTERNATE STORAGE RESOURCES WITHIN A DISPERSED STORAGE NETWORK," filed Jan. 30, 2015, all of which are hereby incorporated herein by reference in their entirety and made part of the present U.S. Utility Patent Application for all purposes.

BACKGROUND

Technical Field

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

Some distributed systems employ scanning agents to identify storage errors in the system. In general, the time to locate missing data is bounded by the time it takes these scanning agents to complete their scanning operations. Completion of scanning operations in a timely manner can be important to maintain system reliability at a desired level. However, if a system uses too much bandwidth for performing scanning operations, the efficient storage and retrieval of data can be adversely impacted.

DETAILED DESCRIPTION

Figure 1:
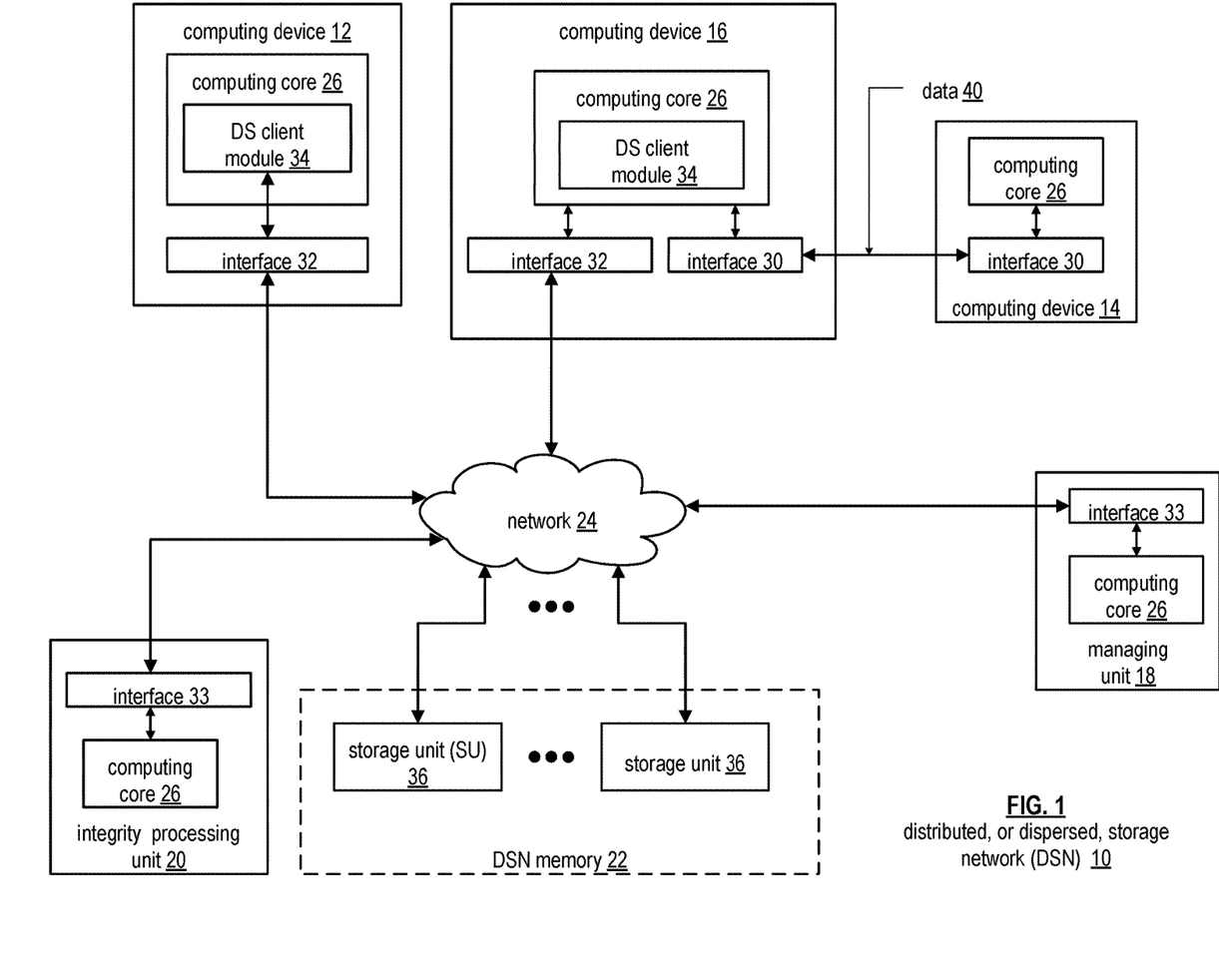
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
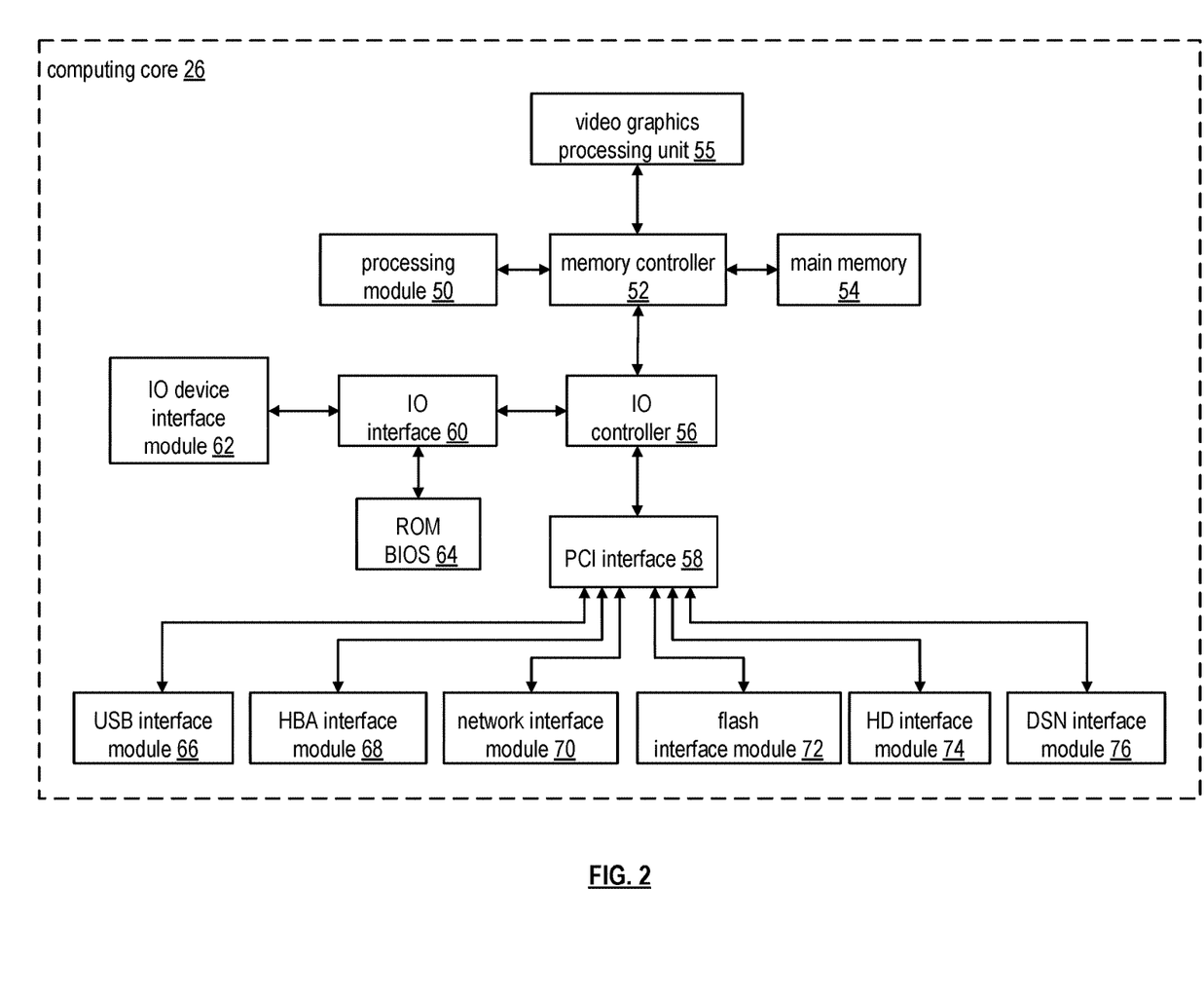
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

Figure 3:
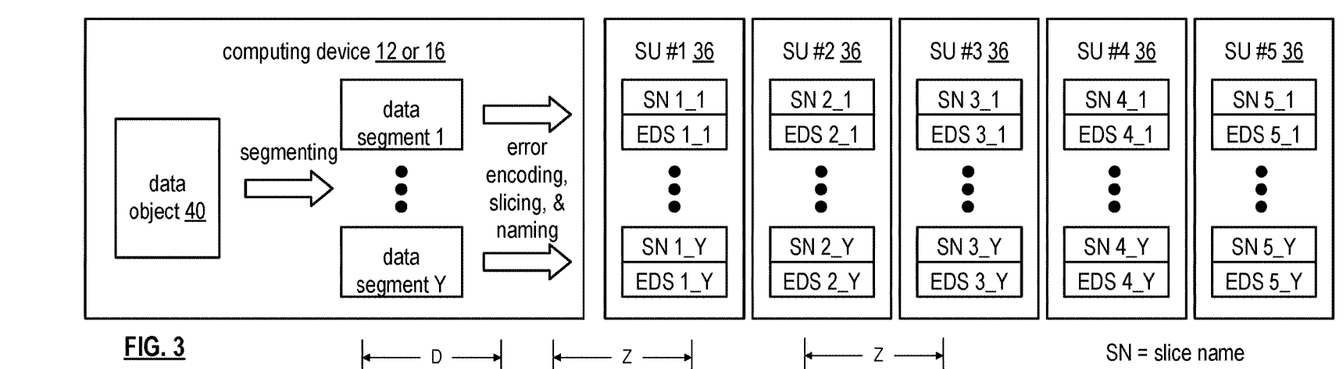
FIG. 3 is a schematic block diagram of an example of dispersed storage error encoding of data in accordance with the present invention.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

Figures 4, 5:
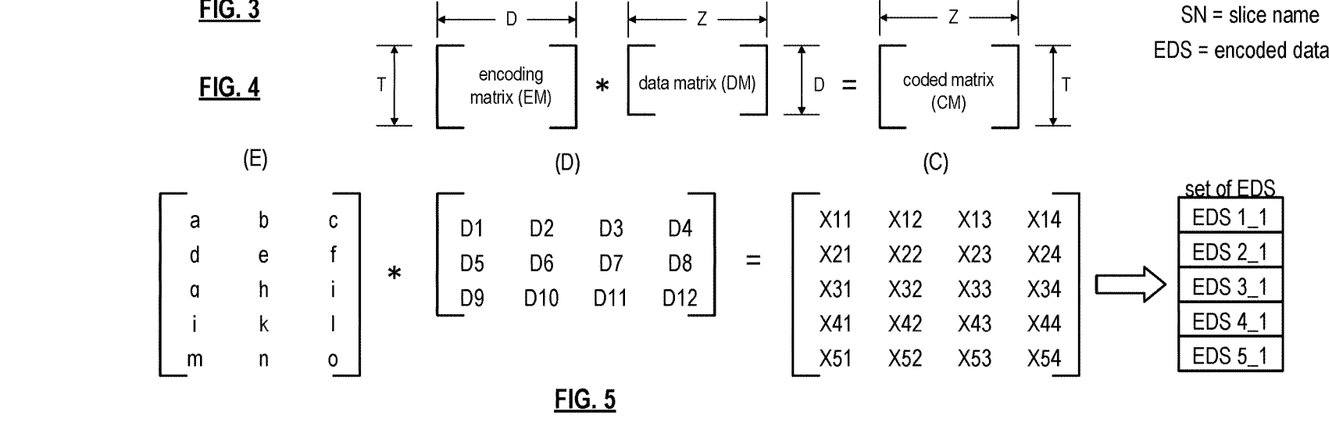
FIG. 4 is a schematic block diagram of a generic example of an error encoding function in accordance with the present invention.
FIG. 5 is a schematic block diagram of a specific example of an error encoding function in accordance with the present invention.

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Figure 6:
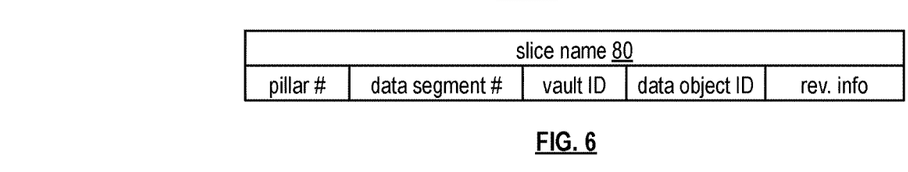
FIG. 6 is a schematic block diagram of an example of a slice name of an encoded data slice (EDS) in accordance with the present invention.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figures 7, 8:
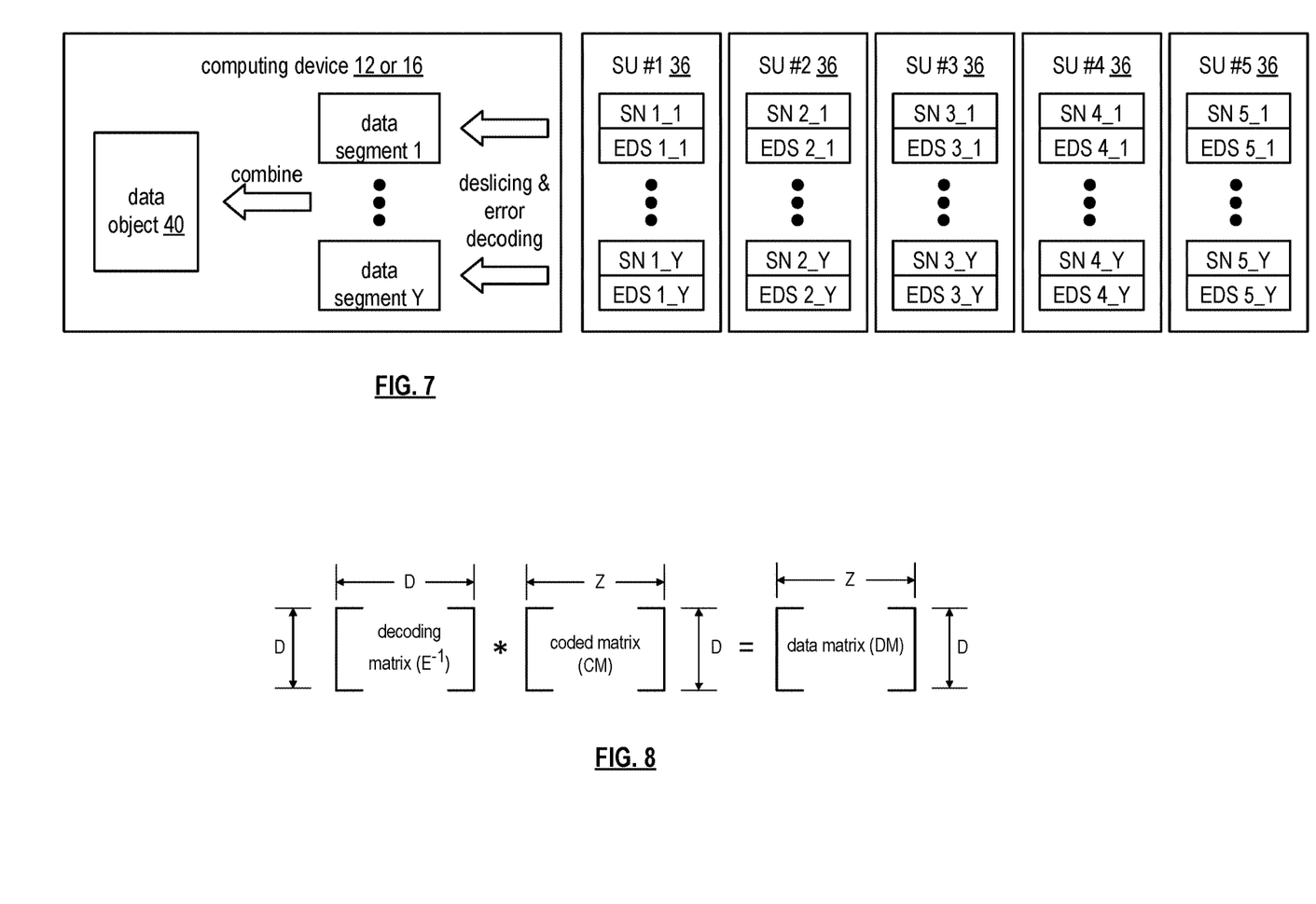
FIG. 7 is a schematic block diagram of an example of dispersed storage error decoding of data in accordance with the present invention.
FIG. 8 is a schematic block diagram of a generic example of an error decoding function in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
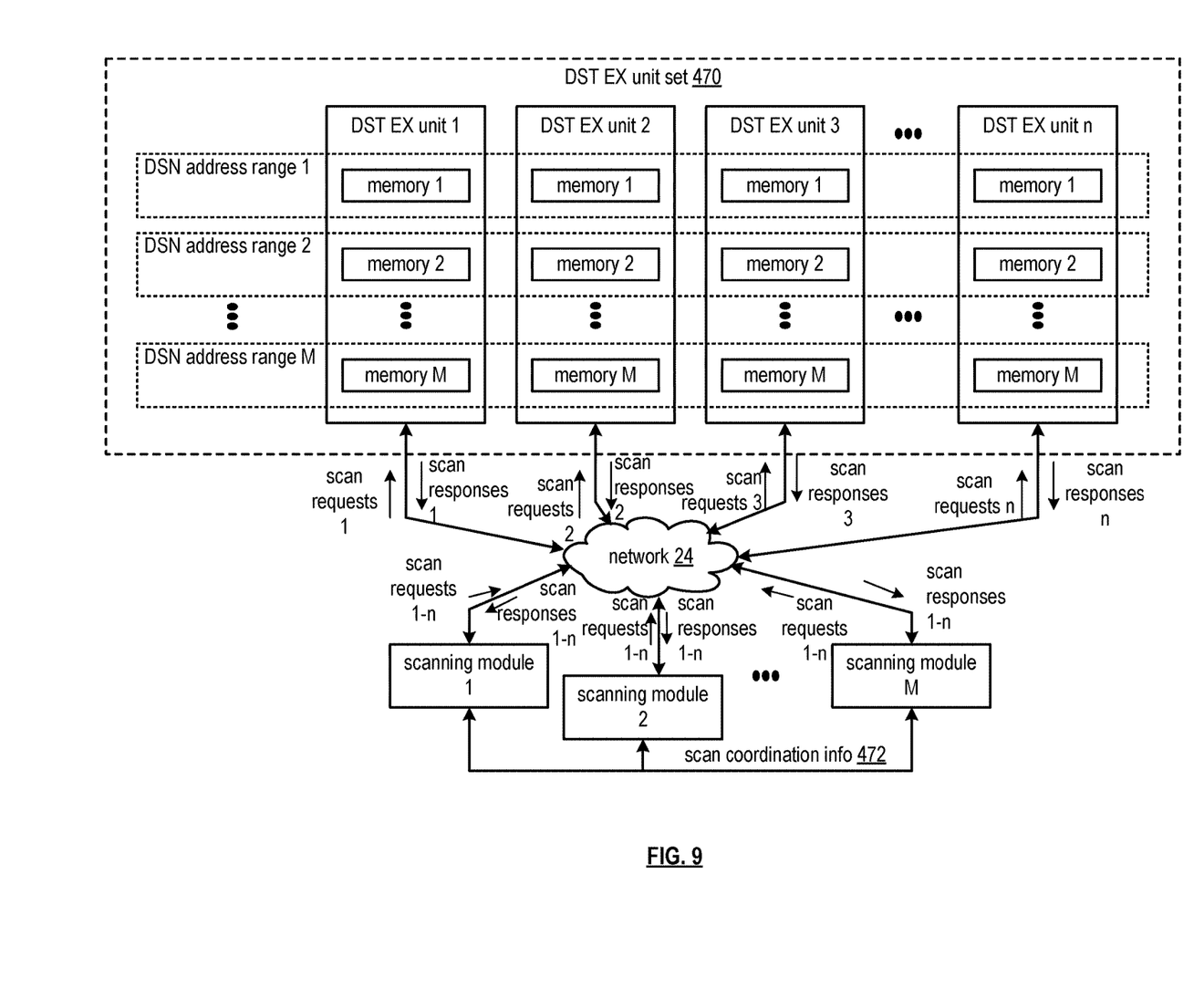
FIG. 9 is a schematic block diagram of an embodiment of a dispersed storage network (DSN) in accordance with the present invention.
Figure 10:
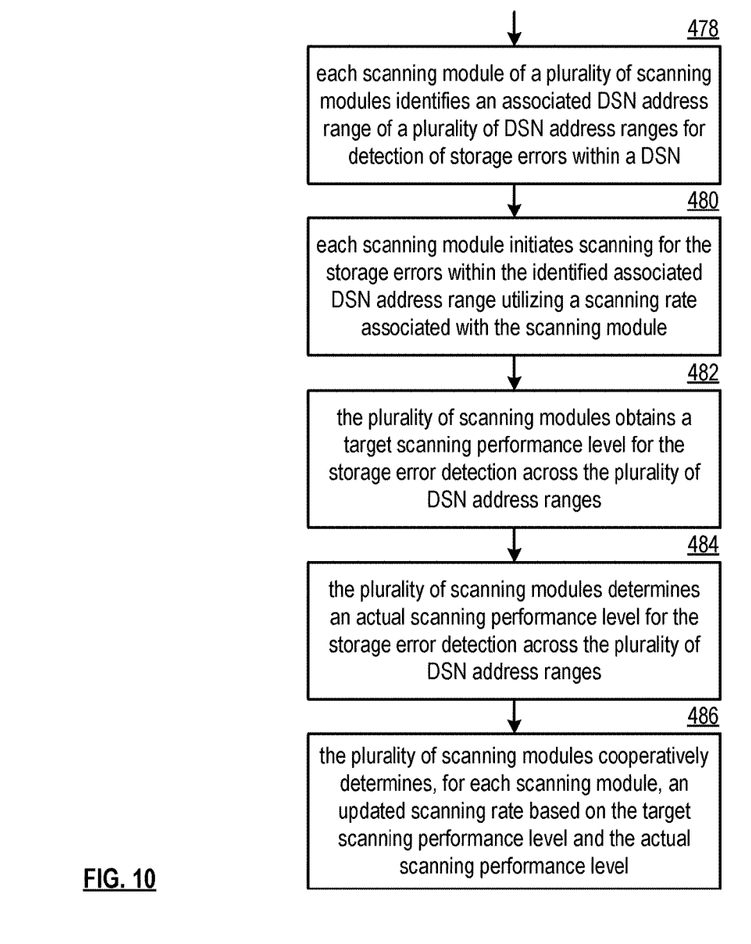
FIG. 10 is a flowchart illustrating an example of cooperatively detecting a storage error in accordance with the present invention.

Referring next to FIGS. 9 and 10, adaptive scanning rates will be discussed in accordance with various embodiments. In various embodiments, scanning agents, can identify lost or corrupted data using any number of techniques. For example, a scanning agent can determine that a particular item of data may have been lost or corrupted by receiving an error message or report from a device that receives an error notification in response to a read or write request. Similarly, a storage unit that encounters an error during either a read or write operation can report the error to a scanning agent. In other implementations, a scanning agent can periodically request status from one or more storage units, and use the responses received to those status requests to identify potentially lost or corrupted data. For example, a scanning agent can request a storage unit, or a particular memory included in that storage unit, to provide a listing of some or all stored data slices. If the listing returned in response to the request is missing items expected to be included in the list, or if there is a mismatch between slice names, addresses, file size, hash values, or other similar information, the scanning agent can determine that the mismatched information is associated with data loss or corruption. In other embodiments, the scanning agent can use various physical memory tests, such as write/read diagnostics to identify potentially missing or corrupted data. In at least one embodiment discussed herein, however, a scanning agent polls memory devices to request status, or a list of stored encoded data slices, at intervals determined by a scanning rate.

Estimates of system reliability depend on how long it takes to recover lost data, and the recovery time is, in part, dependent on how long it takes on average to locate missing data. The time to locate missing data is bounded by the time it takes rebuild scanning agents to complete their scanning operations against one or more ranges. If reliability estimates assume some upper bound for data recovery time, then scanning agents should be able to guarantee they can scan the entire set of ranges for which they are responsible within that time bound. This creates a problem: either scanning will go faster than is necessarily which needlessly wastes resources of the DSN memory, or it is slower than is necessary, in which case reliability will be less than was estimated. Further complicating the matter is that different vaults, or different vault regions, may contain data of different characteristics, or data stored in different storage paradigms or media types, different average object sizes, and different fill levels (namespace densities). This can cause widely varying scanning speeds for different ranges of the namespace.

To ensure bounds are met without waste, while handling a varied and changing system, various embodiments discussed herein use real-time adaptive scanning rates. To implement adaptive scanning rates, each scanning agent monitors the rates of scanning among all the scanning agents sharing responsibility for certain namespace ranges and the fraction of progress made over a given time interval. From this, each scanning agent calculates the scanning rate required among all the scanning agents if they are to complete the scanning within the given time bound, adjusting as necessary.

The scanning rate may be throttled to lower it below the maximum capacity of the scanning agent. If the scanning agent is unable to scan at a sufficient rate to meet the bound then it may issue warning indicators. Adapting scanning rates in this way can provide many desirable properties. For example, if a scanning agents fails, then other scanning agents can make up for the failure in response to the global scanning rate decreasing. Likewise, if the system is near empty, with few slices to check for errors, the scanning rate can be set to be much slower than if the system were full. As the system fills, and more slices need to be checked, the scanning rate can be accelerated, for example by assigning additional scanning modules or agents, or by using additional available scanning capacity of already assigned scanning modules or agents.

FIG. 9 is a schematic block diagram of another embodiment of a dispersed storage network (DSN) that includes a distributed storage and task (DST) execution (EX) unit set 470, the network 24 of FIG. 1, and a plurality of scanning modules 1-M. The DST execution unit set 470 includes a set of DST execution units 1-n. Each DST execution unit includes a plurality of memories 1-M. Each DST execution unit may be implemented utilizing storage unit 36 of FIG. 1. Each scanning module may be implemented utilizing one or more of the DS client modules 34 of FIG. 1, the managing unit 18 of FIG. 1, the integrity processing unit of FIG. 1, or the DSN memory 22 of FIG. 1.

The DSN functions to detect a storage error, where data is dispersed storage error encoded utilizing an information dispersal algorithm (IDA) function to produce a plurality of sets of encoded data slices for storage in the set of DST execution units 1-n. Each set of encoded data slices is associated with a set of slice names. Each set of slice names falls within a particular DSN address range of a plurality of DSN address ranges 1-M associated with the DST execution unit set. Each DSN address ranges associated with a set of memories of the set of DST execution units 1-n. For example, each memory 1 of the DST execution units 1-n is included in a first set of memories and is associated with a DSN address range 1. As such, encoded data slices associated with consecutive slice names of the DSN address range 1 are stored in the first set of memories 1. A set of memories may support more than one DSN address ranges.

In an example of operation of the detecting of the storage error, each scanning module identifies an associated DSN address range of the plurality of DSN address ranges for detection of storage errors. Each scanning module may be associated with one or more DSN address ranges. The identifying includes one or more of interpreting system registry information, receiving scanning assignment information, identifying a need for scanning, interpreting an error message, and interpreting a received request. For example, the scanning module 1 identifies the DSN address range 1 for the detection of the storage errors based on interpreting the system registry information.

Having identified the associated DSN address range, each scanning module initiates scanning for the storage errors within the identified associated DSN address range utilizing a scanning rate (e.g., scan requests issued per unit of time) associated with the scanning module. The initiating includes one or more of issuing scan requests and receiving scan responses. For example, the scanning module 1 issues scan requests 1-n, where each scan request includes a list slice request, receives scan responses 1-n, where each scan response includes a list slice response, and interprets the scan responses 1-n to identify the storage errors (e.g., comparing a set of list slice responses to identify missing slices, receiving a corrupted slice information in a response).

Having initiated the scanning, the plurality of scanning modules obtains a target scanning performance level for the plurality of DSN address ranges. The plurality of scanning modules may obtain the target scanning performance level by exchanging scan coordination information 472 between the scanning modules. The scan coordination information 472 may be communicated directly or via the network 24. The obtaining may further include one or more of interpreting the system registry information, receiving the target scanning performance level, and interpreting a query response. The target scanning performance level includes at least one of an average scanning rate (e.g., sets of DSN addresses per second) and a maximum time frame for scanning through the plurality of DSN address ranges.

Having obtained the target scanning performance level, a plurality of scanning modules determines an actual scanning performance level for the plurality of DSN address ranges. The determining includes at least one of measuring the actual scanning performance levels and receiving the actual performance scanning levels. For example, each scanning module reports the actual scanning performance level associated with the scanning module to each of the plurality of scanning modules via the sharing of the scan coordination information.

Having determined the actual scanning performance level for the plurality of DSN address ranges, the plurality of scanning modules cooperatively determines, for each scanning module, an updated scanning rate based on the target scanning performance level and the actual scanning performance level. For example, when the actual scanning performance level is less than the target scanning performance level, the plurality of scanning modules determines updated scanning rates to be higher than the scanning rates such that a newly forecasted completion time frame is substantially the same as the maximum time frame for scanning through the plurality of DSN address ranges. Having determined the updated scanning rates, the plurality of scanning modules adjusts the scanning for the storage errors in accordance with the updated scanning rates.

FIG. 10 is a flowchart illustrating an example of cooperatively detecting a storage error. The method includes step 478 where each scanning module of a plurality of scanning modules identifies an associated dispersed storage network (DSN) address range of a plurality of DSN address ranges for detection of storage errors within a DSN. The identifying includes at least one of interpreting system registry information, interpreting a received message, and interpreting a request.

The method continues at step 480 where each scanning module initiates scanning for the storage errors within the identified associated DSN address range utilizing a scanning rate associated with the scanning module. For example, the scanning module obtains the scanning rate by calculating a rate based on a target completion time frame, issues list slice requests to a set of storage units associated with the DSN address range in accordance with the scanning rate, and interprets received list slice responses to identify the storage error.

The method continues at step 482 where the plurality of scanning modules obtains a target scanning performance level for the storage error detection across the plurality of DSN address ranges. The obtaining includes at least one of interpreting system registry information, receiving, interpreting a query response, and interpreting scan coordination information.

The method continues at step 484 where the plurality of scanning modules determines an actual scanning performance level for the storage error detection across the plurality of DSN address ranges. The determining includes one or more of receiving a scanning performance level associated with one or more of the plurality of scanning modules, determining an aggregate performance level of the received scanning performance levels as the actual scanning performance level, and updating scan coordination information shared with other scanning modules.

The method continues at step 486 where the plurality of scanning modules cooperatively determines, for each scanning module, an updated scanning rate based on the target scanning performance level and the actual scanning performance level. The determining includes one or more of estimating a required updated scanning rate for each scanning module based on one or more of the scanning rate for the scanning module, a target scanning performance level, and the actual scanning performance level such that the estimated required updated scanning rate enables the plurality of scanning modules to substantially complete a level of desired scanning within an associated scanning time frame.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for use in a distributed storage network (DSN) storing encoded data slices in dispersed storage (DS) memories using a DSN namespace divided into a plurality of DSN address ranges, the method comprising:
identifying, using a processor and associated memory included in each scanning module of a plurality of scanning modules, identified DSN address ranges for detection of storage errors within the DSN namespace;
initiating, using the processor and associated memory included in each scanning module of a plurality of scanning modules, scanning for the storage errors within the identified DSN address ranges, wherein each individual scanning module scans for errors in accordance with a scanning rate associated with the individual scanning module;
obtaining, using the processor and associated memory included in each scanning module, a target scanning performance level, the target scanning performance level specifying a scanning performance level for the detection of storage errors across DSN address ranges associated with more than one scanning module;

determining, using the processor and associated memory included in each scanning module, an actual scanning performance level for storage error detection across the plurality of DSN address ranges;

cooperatively determining, by the plurality of scanning modules, an updated scanning rate for each scanning module, the cooperatively determining based on the target scanning performance level and the actual scanning performance level; and altering a scanning rate of at least one of the plurality of scanning modules to match the updated scanning rate.

2. The method of claim 1, further comprising:

throttling the scanning rate of the at least one of the plurality of scanning modules to less than maximum capacity in response to the updated scanning rate for the at least one of the plurality of scanning modules decreasing.

3. The method of claim 1, the cooperatively determining including:

determining, by each of scanning module, a scanning rate required among the plurality of scanning modules for the plurality of scanning modules to complete a scan of the DSN namespace within a given period of time.

4. The method of claim 1, further comprising:

in response to a determination, by an individual scanning module, that the individual scanning module is unable to scan at a rate sufficient to meet the updated scanning rate, transmitting a warning indicator from the individual scanning module to other scanning modules of a plurality of scanning modules.

5. The method of claim 1, further comprising:

in response to detecting a failure of an individual scanning module, transferring responsibility for scanning a DSN address range associated with the individual scanning module to one or more other storage modules.

6. The method of claim 1, wherein scanning for storage errors by an individual scanning module includes:

issuing a list slice request from the individual scanning module to a storage unit within a DSN address range associated with the individual scanning module; and interpreting a response to the list slice request to identify a storage error.

7. The method of claim 1, wherein:

at least one scanning module is implemented by a storage unit including a processing core and a plurality of DS memories.

8. A scanning module for use in a distributed storage network (DSN) storing encoded data slices in dispersed storage (DS) memories using a DSN namespace divided into a plurality of DSN address ranges, the scanning module comprising:

a processor and associated memory;

a network interface coupled to the processor and associated memory, the network interface configured to couple the scanning module to a plurality of other scanning modules associated with different DSN address ranges for detection of storage errors within the DSN namespace;

the processor and associated memory configured to:

determine an identified DSN address range for detection of storage errors within the DSN namespace;

initiate scanning for the storage errors within the identified DSN address range, wherein scanning for the storage errors is performed in accordance with a scanning rate associated with the scanning module;

obtain a target scanning performance level, the target scanning performance level specifying a scanning performance level for the detection of storage errors across the DSN namespace;

determine an actual scanning performance level for storage error detection across the DSN namespace;

determine, in cooperation with the plurality of other scanning modules, an updated scanning rate for both the scanning module and the plurality of other scanning modules, based on the target scanning performance level and the actual scanning performance level; and alter a scanning rate of the scanning module to match the updated scanning rate.

9. The scanning module of claim 8, the processor and associated memory further configured to:

throttle the scanning rate of the scanning module to less than maximum capacity in response to the updated scanning rate decreasing.

10. The scanning module of claim 8, the processor and associated memory further configured to:

determine a scanning rate required, among both the scanning module and the plurality of other scanning modules, to complete a scan of the DSN namespace within a given period of time.

11. The scanning module of claim 8, the processor and associated memory further configured to:

determine that the scanning module is unable to scan at a rate sufficient to meet the updated scanning rate; and in response to determining that the scanning module is unable to scan at a rate sufficient to meet the updated scanning rate, transmit a warning indicator to the plurality of other scanning modules.

12. The scanning module of claim 8, the processor and associated memory further configured to:

detect a failure of at least one of the other scanning modules; and in response to detecting the failure, transfer responsibility for scanning at least a portion of the identified DSN address range to one or more of the other storage modules.

13. The scanning module of claim 8, wherein scanning for storage errors by an individual scanning module includes:

issuing a list slice request from the individual scanning module to a storage unit within a DSN address range associated with the individual scanning module; and interpreting a response to the list slice request to identify a storage error.

14. The scanning module of claim 8, wherein:

the scanning module is implemented by a storage unit including a processing core and a plurality of DS memories.

15. A distributed storage network (DSN), comprising:

a plurality of storage units, each of the plurality of storage units including a plurality of dispersed storage (DS) memories used to store encoded data slices in accordance with a DSN namespace divided into a plurality of DSN address ranges;

a plurality of scanning modules, each scanning module including:

a processor and associated memory;

a network interface coupled to the processor and associated memory, the network interface configured to couple the scanning module to a plurality of other scanning modules associated with different DSN address ranges for detection of storage errors within the DSN namespace;

the processor and associated memory configured to:
- determine an identified DSN address range for detection of storage errors within the DSN namespace;
- initiate scanning for the storage errors within the identified DSN address range, wherein scanning for the storage errors is performed in accordance with a scanning rate associated with the scanning module;
- obtain a target scanning performance level, the target scanning performance level specifying a scanning performance level for the detection of storage errors across the DSN namespace;
- determine an actual scanning performance level for storage error detection across the DSN namespace;
- determine, in cooperation with the plurality of other scanning modules, an updated scanning rate for both the scanning module and the plurality of other scanning modules, based on the target scanning performance level and the actual scanning performance level; and
- alter a current scanning rate of the scanning module to match an updated scanning rate.

16. The distributed storage network (DSN) of claim 15, the processor and associated memory further configured to:
throttle the scanning rate to less than maximum capacity in response to the updated scanning rate for the at least one of the plurality of scanning modules decreasing.

17. The distributed storage network (DSN) of claim 15, the processor and associated memory further configured to:
determine a scanning rate required, among both the scanning module and the plurality of other scanning modules, to complete a scan of the DSN namespace within a given period of time.

18. The distributed storage network (DSN) of claim 15, the processor and associated memory further configured to:
- determine that the scanning module is unable to scan at a rate sufficient to meet the updated scanning rate; and
- in response to determining that the scanning module is unable to scan at a rate sufficient to meet the updated scanning rate, transmit a warning indicator to the plurality of other scanning modules.

19. The distributed storage network (DSN) of claim 15, the processor and associated memory further configured to:
- detect a failure of at least one of the other scanning modules; and
- in response to detecting the failure, transfer responsibility for scanning at least a portion of the identified DSN address range to one or more of the other storage modules.

20. The distributed storage network (DSN) of claim 15, wherein scanning for storage errors by an individual scanning module includes:
- issuing a list slice request from the individual scanning module to a storage unit within a DSN address range associated with the individual scanning module; and
- interpreting a response to the list slice request to identify a storage error.

* * * * *